(12) United States Patent
Eastman et al.

(10) Patent No.: US 12,207,364 B2
(45) Date of Patent: Jan. 21, 2025

(54) ELECTROCALORIC FIBER, FABRIC AND SYSTEM COMPRISING SAME

(71) Applicant: Carrier Corporation, Palm Beach Gardens, FL (US)

(72) Inventors: Scott Alan Eastman, Glastonbury, CT (US); Sergei F. Burlatsky, West Hartford, CT (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 89 days.

(21) Appl. No.: 15/734,417

(22) PCT Filed: Sep. 10, 2020

(86) PCT No.: PCT/US2020/050292
§ 371 (c)(1),
(2) Date: Dec. 2, 2020

(87) PCT Pub. No.: WO2021/050802
PCT Pub. Date: Mar. 18, 2021

(65) Prior Publication Data
US 2022/0377852 A1    Nov. 24, 2022

Related U.S. Application Data

(60) Provisional application No. 62/899,394, filed on Sep. 12, 2019.

(51) Int. Cl.
*H05B 3/34* (2006.01)
*D01F 8/18* (2006.01)
(Continued)

(52) U.S. Cl.
CPC ............ *H05B 3/342* (2013.01); *D01F 8/18* (2013.01); *H05B 3/141* (2013.01); *H05B 3/146* (2013.01);
(Continued)

(58) Field of Classification Search
CPC .............. H10N 10/85; D10B 2401/18; F25B 2321/001
(Continued)

(56) References Cited

U.S. PATENT DOCUMENTS

| 4,521,485 A | * | 6/1985 | Tondre | ..................... H01B 3/30 174/120 SR |
| 4,637,955 A | * | 1/1987 | Glaister | ................. H01B 7/292 174/110 V |

(Continued)

FOREIGN PATENT DOCUMENTS

| CN | 2659076 Y | 11/2004 |
| CN | 1726419 A | 1/2006 |

(Continued)

OTHER PUBLICATIONS

International Search Report for PCT/US2020/050292; Application Filing Date: Sep. 11, 2020; Date of Mailing: Dec. 10, 2020; 5 pages.
(Continued)

*Primary Examiner* — Elizabeth M Imani
(74) *Attorney, Agent, or Firm* — CANTOR COLBURN LLP

(57) ABSTRACT

An electrocaloric fiber includes an electrocaloric material surrounding a centrally located electrode. The electrocaloric fiber may further include an outer electrode surrounding the electrocaloric material. The electrocaloric fiber may be used to form an electrocaloric fabric.

20 Claims, 5 Drawing Sheets

(51) Int. Cl.
*H05B 3/14* (2006.01)
*H10N 10/85* (2023.01)

(52) U.S. Cl.
CPC ......... *H10N 10/85* (2023.02); *D10B 2401/16* (2013.01); *D10B 2401/18* (2013.01); *D10B 2403/02431* (2013.01)

(58) Field of Classification Search
USPC .......................................................... 428/379
See application file for complete search history.

(56) References Cited

U.S. PATENT DOCUMENTS

| | | | |
|---|---|---|---|
| 4,700,054 A | | 10/1987 | Triplett et al. |
| 10,844,524 B1 * | | 11/2020 | Sunshine ................ H05K 3/103 |
| 2008/0234788 A1 * | | 9/2008 | Wasowski ................ A43B 7/34 |
| | | | 607/104 |
| 2019/0003747 A1 | | 1/2019 | Walker et al. |
| 2019/0003748 A1 | | 1/2019 | Gorbounov et al. |

FOREIGN PATENT DOCUMENTS

| | | |
|---|---|---|
| CN | 102123529 A | 7/2011 |
| CN | 202865492 U | 4/2013 |
| CN | 108369041 A | 8/2018 |
| WO | 2018232393 A1 | 12/2018 |

OTHER PUBLICATIONS

Written Opinion for PCT/US2020/050292; Application Filing Date: Sep. 11, 2020; Date of Mailing: Dec. 10, 2020; 7 pages.

\* cited by examiner

ELECTROCALORIC FIBER, FABRIC AND SYSTEM COMPRISING SAME

CROSS REFERENCE TO RELATED APPLICATIONS

This application is a National Stage application of PCT/US2020/050292, filed Sep. 11, 2020, which claims the benefit of U.S. Provisional Application No. 62/899,394, filed Sep. 12, 2019, both of which are incorporated by reference in their entirety herein.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. Similarly, the weight and power requirements of the compressor can be problematic in various portable cooling applications.

Accordingly, there has been interest in developing cooling technologies as alternatives to vapor compression refrigerant loops. Various technologies have been proposed such as field-active heat or electric current-responsive heat transfer systems relying on materials such as electrocaloric materials, magnetocaloric materials, or thermoelectric materials. In the evolving field of electrocaloric materials there is an ongoing need for electrocaloric materials having improved capabilities.

BRIEF DESCRIPTION

In some embodiments of this disclosure, an electrocaloric fiber includes an electrocaloric material surrounding a centrally located electrode. The electrocaloric fiber may further include an outer electrode surrounding the electrocaloric material. The electrocaloric fiber may be used to form an electrocaloric fabric.

According to any one or combination of the above embodiments, the fiber has a circular transverse cross section with a diameter of 0.5 to 500 micrometers.

According to any one or combination of the above embodiments, the outer electrode includes a metallized layer, a doped semiconductor, an electrically conductive ceramic, a conductive polymer, or combination thereof.

According to any one or combination of the above embodiments, the electrocaloric material has a thickness of 0.5 to 200 micrometers.

According to any one or combination of the above embodiments, the electrocaloric material includes an inorganic material, electrocalonc polymer or polymer/ceramic composite.

According to any one or combination of the above embodiments, the centrally located electrode includes carbon fiber, nanotube strand, metallic microwire, metal coated glass microwire, glass coated metal microwire, metal coated ceramic fiber, and metal coated. polymer fiber.

In some embodiments, an electrocaloric fabric includes an outer electrode deposited on woven electrocaloric fibers wherein the electrocaloric fibers include electrocaloric material surrounding centrally located electrodes.

According to any one or combination of the above embodiments, the outer electrode includes a metallized layer, a doped semiconductor, an electrically conductive ceramic, a conductive polymer, or combination thereof.

According to any one or combination of the above embodiments, the electrocaloric material has a thickness of 0.5 to 200 micrometers.

According to any one or combination of the above embodiments, the electrocaloric material includes an inorganic material, electrocaloric polymer or polymer/ceramic composite.

According to any one or combination of the above embodiments, the centrally located electrodes include carbon fiber, nanotube strand, metallic microwire, metal coated glass microwire, glass coated metal microwire, metal coated ceramic fiber, and metal coated polymer fiber.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

DETAILED DESCRIPTION

Figure 1:
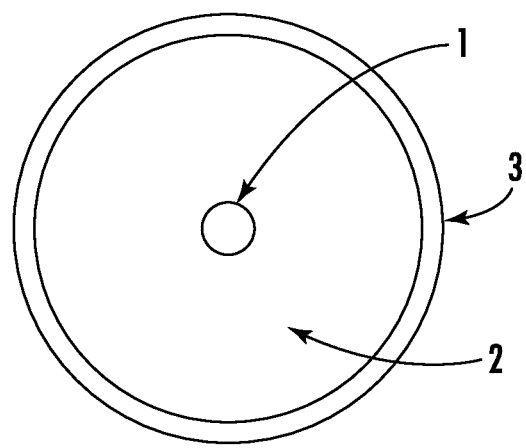
FIGS. 1 and 2 show cross sections of the electrocaloric fiber.
Figure 2:
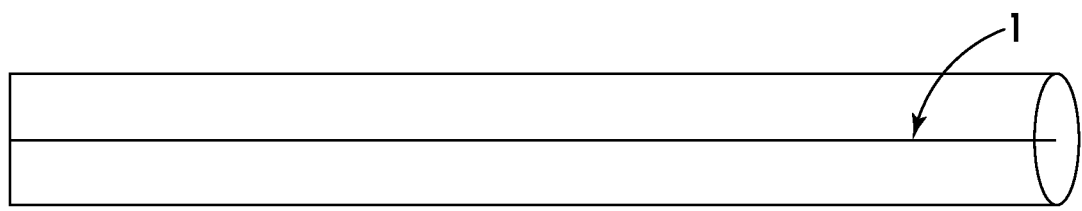

Disclosed herein is an electrocaloric fiber, an electrocaloric fabric comprising the fiber, methods of making the electrocaloric fiber and fabric and a system which employs the electrocaloric fabric. As shown in FIG. 1, the electrocaloric fiber comprises an electrocaloric material 2 surrounding a central electrode 1. The electrocaloric material may surrounded by an outer electrode 3. FIG. 2 is a transverse view of the electrocaloric fiber.

The central electrode is in the form of a fiber and the electrocaloric material is drawn onto the central electrode to form an electrocaloric fiber. The process of drawing the electrocaloric material onto the central electrode can facilitate alignment or orientation of the molecules which make up the electrocaloric material. When the electrocaloric material is a polymer the drawing process increases polymer chain orientation and crystallinity. The increased orientation and crystallinity results in a greater temperature lift per volume of material which translates to greater efficiently and capacity for the material. These electrocaloric fibers can then be coated with electrodes, dielectrics or both and incorporated into fabrics which have substantially greater surface area than the conventional thin film module designs and may even allow more even distribution of air flow through the fabric as compared with individually stacked films.

Fabrics created from the electrocaloric fibers and yarns formed from the electrocaloric fibers are more robust to module assembly and system use processes and environments. Additionally there are system layout benefits for the higher surface area to module volume which results in enhanced system performance. Fluid flow issues found in thin film approaches are minimized by using a fabric porous media.

The central electrode is a continuous electrically conductive fiber. The central electrode is in electrical contact with the surrounding electrocaloric material. Exemplary central electrodes include carbon fiber, continuous or chopped nanotube strand, metallic microwire, metal coated glass microwire, glass coated metal microwire, metal coated ceramic fiber, and metal coated polymer fiber. Exemplary polymers used in the metal coated polymer fiber include polyesters, polyamides, and conjugations of polyester, polyamide and polypropylene, The central electrode may have a diameter of 0.5 micrometer ($\mu m$) to 500 $\mu m$, or 1 $\mu m$ to 200 $\mu m$, or 1 $\mu m$ to 75 $\mu m$.

Examples of electrocaloric materials include inorganic materials (e.g., ceramics), electrocaloric polymers, and polymer/ceramic composites. Examples of inorganics include but are not limited to $PbTiO_3$ ("PT"), $Pb(Mg_{1/3}Nb_{2/3})O_3$ ("PMN"), PMN-PT, $LiTaO_3$, barium strontium titanate (BST) or PZT (lead, zirconium, titanium, oxygen). Examples of electrocaloric polymers include, but are not limited to ferroelectric polymers, liquid crystal polymers, and liquid crystal elastomers.

Ferroelectric polymers are crystalline polymers, or polymers with a high degree of crystallinity, where at least a portion of the crystalline phase is electrocalorically active and thus can be manipulated by an external electric field to change the crystalline phase from a more ordered (less entropy) state to a less ordered (more entropy) state and result in temperature changes in the material due to the change in phase. Such characteristics can be provided by polar structures integrated into the polymer backbone or appended to the polymer backbone with a fixed orientation to the backbone. Examples of ferroelectric polymers include poly vinylidene fluoride (PVDF), polytrifluoroethylene fluoride, odd-numbered nylon, copolymers containing repeat units derived from vinylidene fluoride, and copolymers containing repeat units derived from vinylidene fluoride. Polyvinylidene fluoride and copolymers containing repeat units derived from vinylidene fluoride have been widely studied for their ferroelectric and electrocaloric properties. Examples of vinylidene fluoride-containing copolymers include copolymers with methyl methacrylate, and copolymers with one or more halogenated co-monomers including but not limited to trifluoroethylene, tetrafluoroethylene, chlorotrifluoroethylene, chlorofluoroethylene. trichloroethylene, vinylidene chloride, vinyl chloride, and other halogenated unsaturated monomers.

Liquid crystal polymers, or polymer liquid crystals comprise polymer molecules that include mesogenic groups. Mesogenic molecular structures are well-known, and are often described as rod-like or disk-like molecular structures having electron density orientations that produce a dipole moment in response to an external field such as an external electric field. Liquid crystal polymers typically comprise numerous mesogenic groups connected by non-mesogenic molecular structures. The non-mesogenic connecting structures and their connection, placement and spacing in the polymer molecule along with mesogenic structures are important in providing the fluid deformable response to the external field. Typically, the connecting structures provide stiffness low enough so that molecular realignment is induced by application of the external field, and high enough to provide the characteristics of a polymer when the external field is not applied.

In some exemplary embodiments, a liquid crystal polymer can have rod-like mesogenic structures in the polymer backbone separated by non-mesogenic spacer groups having flexibility to allow for re-ordering of the mesogenic groups in response to an external field. Such polymers are also known as main-chain liquid crystal polymers. In some exemplary embodiments, a liquid crystal polymer can have rod-like mesogenic structures attached as side groups attached to the polymer backbone. Such polymers are also known as side-chain liquid crystal polymers.

The electrocaloric material is drawn onto the central electrode to form the electrocaloric fiber. In the case of polymer electrocaloric materials, they can be deposited from a solution containing the solubilized or suspended polymer or from the polymer melt. Inorganic electrocaloric materials may be deposited by chemical vapor deposition techniques although it is possible to melt deposit these materials if the melting point of the inorganic material is lower than the fiber electrode it is being deposited onto. The transverse cross section of the electrocaloric fiber may be the same shape as the central electrode or may differ from the transverse cross section of the central electrode. The electrocaloric material surrounds the central electrode and may have a thickness of 0.5$\mu m$ to 200 $\mu m$, or 1 $\mu m$ to 100 or, 5 $\mu m$ to 50 $\mu m$.

The electrocaloric fiber may have a circular transverse cross section with a diameter of 1 $\mu m$ to 700 $\mu m$, or, 2 $\mu m$ to 400 $\mu m$, or 5 $\mu m$ to 100 $\mu m$. This diameter may be with or without the outer electrode.

The outer electrode may be applied to each electrocaloric fiber individually and then woven into the electrocaloric fabric. Multiple fibers can be combined into yarns and then covered with an outer electrode and woven into the electrocaloric fabric.

Alternatively the electrocaloric fiber may be woven into a fabric (either singly or as a yarn) and the outer electrode applied to the woven fabric. When the outer electrode is applied to the fabric it may be applied to one side or both sides of the fabric.

Figure 3:
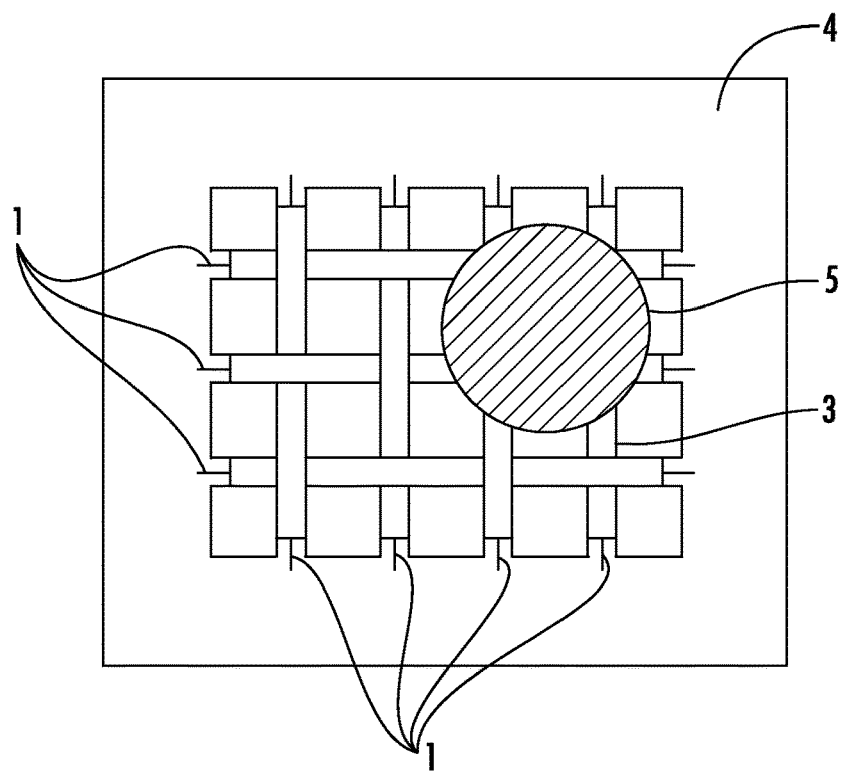
FIGS. 3 and 4 shows an electrocaloric fabric.

Embodiments of the electrocaloric fabric 12 are shown in FIG. 3. The outer electrode is applied either to each electrocaloric fiber individually or to yarns of the electrocaloric fiber. FIG. 3 shows electrocaloric fibers woven to create a fabric 12. The inner electrodes 1 are exposed and connected to bus frame 4. The outer electrodes are connected to an electrode pad 5. Electrode pad 5 could also be a wire or wires. The shapes shown are exemplary only and are for illustration purposes. The fabric and other elements are not limited thereto.

Figure 4:
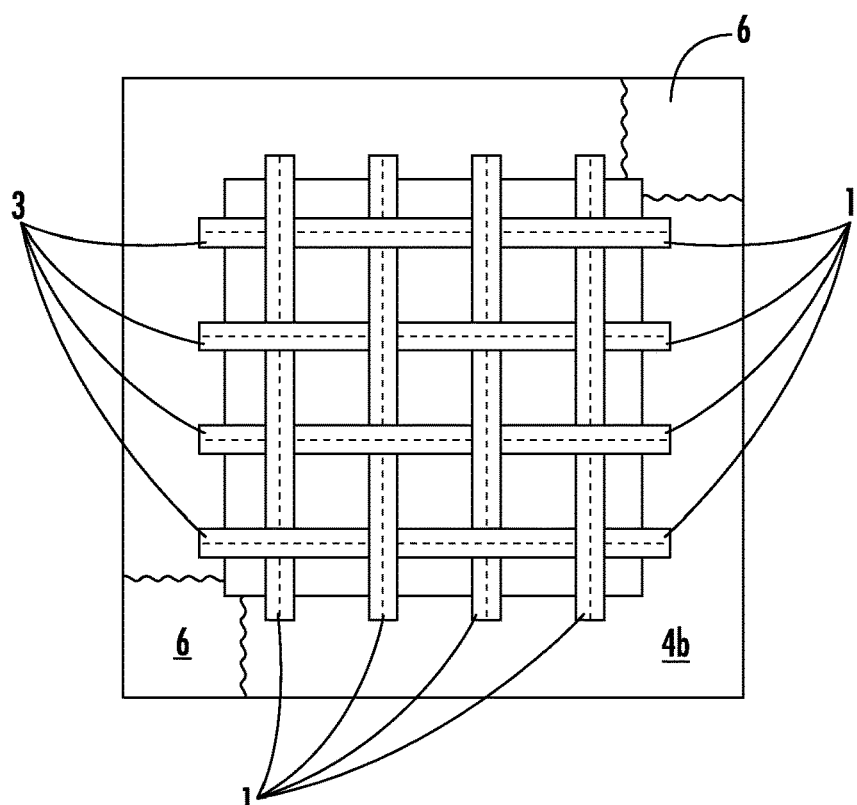

FIG. 4 shows electrocaloric fibers woven to create a fabric 12. The fabric is located in bus frame 4. Bus frame 4 has sides 4a which are connected to outer electrodes 3 and sides 4b which are connected to inner electrodes 1. Bus frame 4 further has insulating corners 6 which separate sides 4a from sides 4b. The shapes shown are exemplary only and the fabric and other elements are not limited thereto.

The electrocaloric fabric may have a thickness of 5 $\mu m$ to 1000 $\mu m$, or 10 $\mu m$ to 750, or 15 $\mu m$ to 500 $\mu m$. The electrocaloric fabric may have a weave that is appropriate to the environmental conditions. Exemplary weaves include herringbone, Dutch twill and over/under. In order to connect to the bus the fabric may have the electrocaloric material absent along at least one edge in order to expose the centrally located electrode.

The outer electrode can be any type of conductive material, including but not limited to metallized layers of a conductive metal such as aluminum or copper, or other conductive materials such as carbon (e.g., carbon nanotubes, graphene, or other conductive carbon). Noble metals can also be used, but are not required. Other conductive materials such as a doped semiconductor, ceramic, or polymer, or conductive polymers can also be used. The outer electrode may have a thickness of 1 nanometer (zeal) to 1000 nm, or 5 nm to 500 nm, or, 10 nm to 100 nm.

Patterned electrodes may be employed when coating the fabric. Patterned electrodes can be applied by a variety of techniques, including ink jet application, vapor deposition, electrodeposition, ion implantation and others. Additional disclosure regarding the application of patterned electrodes is disclosed in disclosed in U.S. Patent Application Ser. No. 62/521,175 filed on Jun. 16, 2017, entitled "Method of Making Electrocaloric Articles", the disclosure of which is incorporated herein by reference in its entirety.

Figure 5:
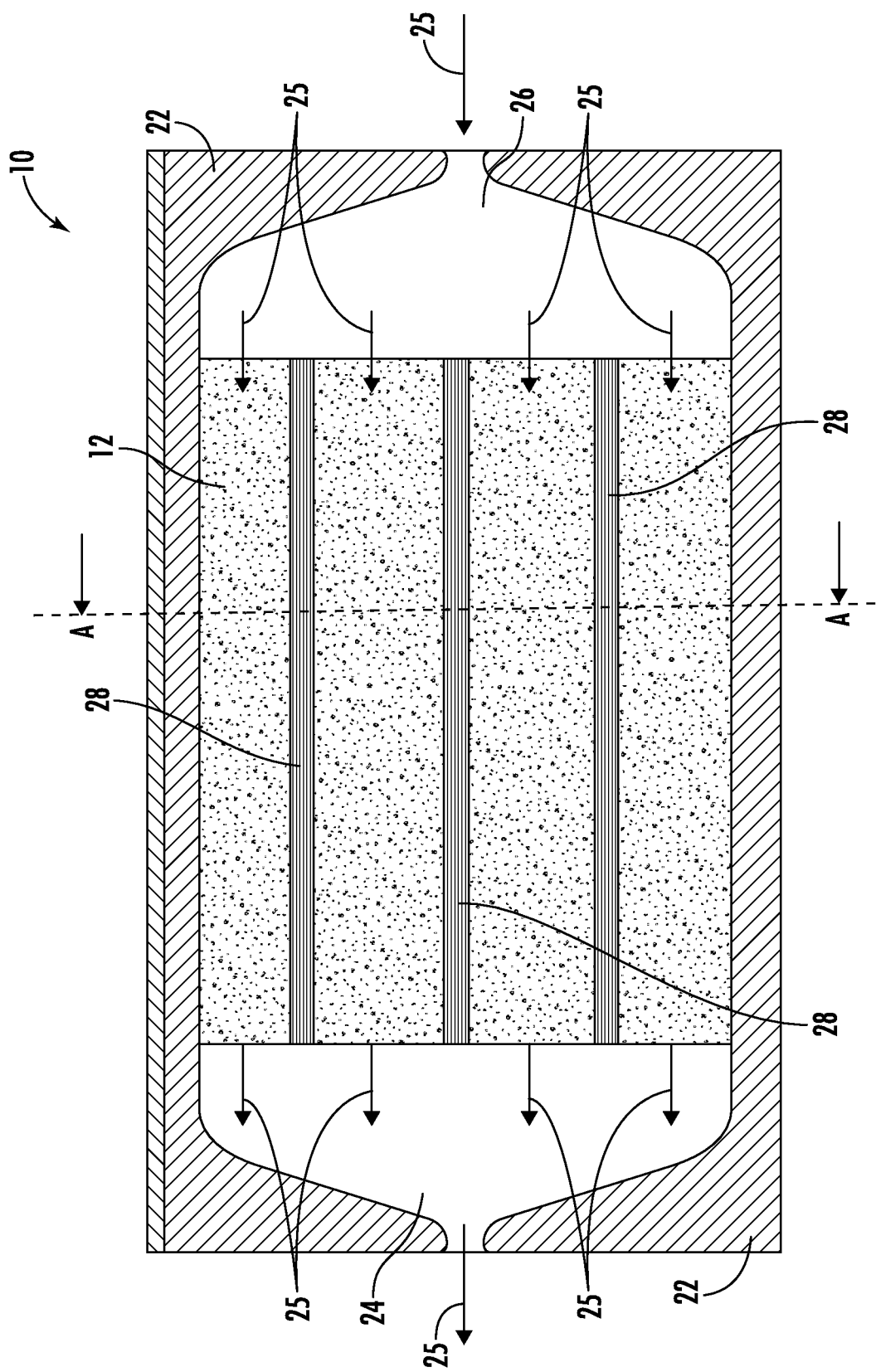
FIG. 5 is a schematic depiction of a top view of an example embodiment of an electrocaloric heat transfer module.
Figure 6:
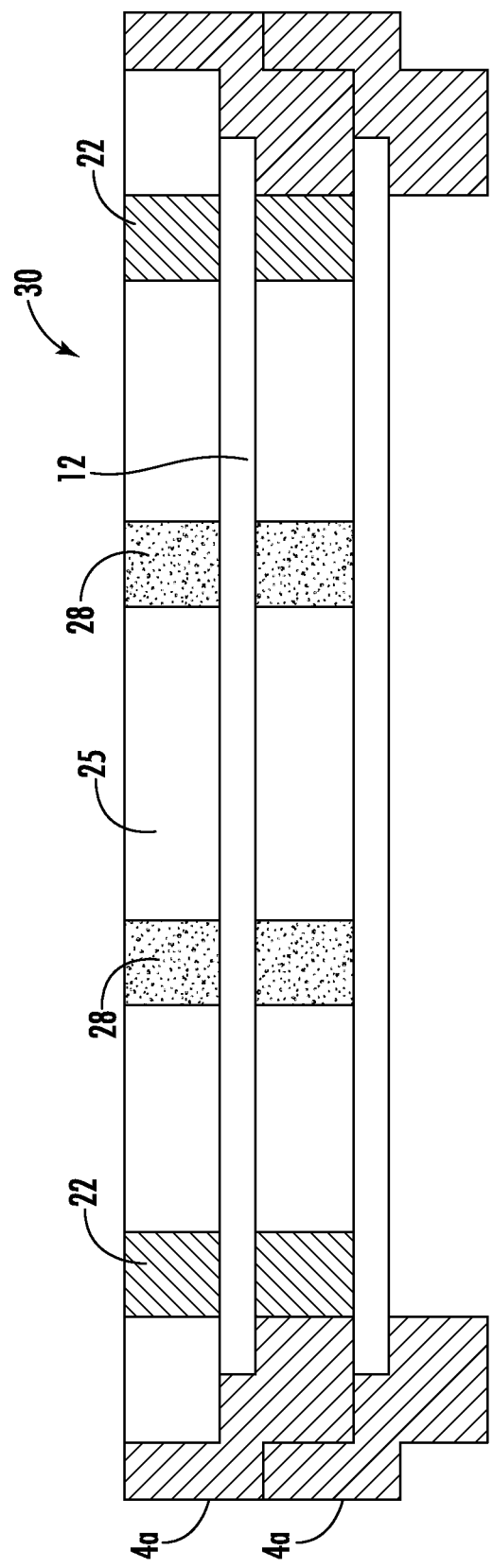
FIG. 6 is a schematic depiction of a cross-sectional side view of an electrocaloric stack included in the module of FIG. 5.

As mentioned above, a heat transfer system is disclosed that includes the electrocaloric fabric. Example embodiments of modules that are part of the system are schematically depicted in FIGS. 5 and 6. Although any directions described herein (e.g., "up", "down", "top", "bottom", "left", "right", "over", "under", etc.) are considered to be arbitrary and to not have any absolute meaning but only a meaning relative to other directions, FIG. 5 can be described as a "top" view of an example embodiment of a module and FIG. 6 can be described as a "side" cross-section view taken along the line A↔A shown in FIG. 5. As shown in FIGS. 5 and 6, an electrocaloric module 10 comprises an electrocaloric element that comprises an electrocaloric fabric 12.

One or more support elements 22 can optionally be included for support and retention of the electrocaloric element. However, separate support elements are not required, as support and retention can also be provided by the bus elements as shown in FIG. 6 described below. As shown in FIG. 5, the support element(s) 22 can be configured to provide header spaces 24 and 26 for transport of working fluids to and from the electrocaloric element along fluid flow path 25. Although not required in all design configurations, in some embodiments, the support elements can be made from an electrically non-conductive material. Spacer elements 28 can optionally be included to help maintain separation from adjacent electrocaloric elements for a fluid flow path for a working fluid (e.g., either a fluid to be heated or cooled directly such as air, or a heat transfer fluid such as a dielectric organic compound). Any configuration of spacer elements can be utilized, such as a set of discrete disk spacer elements or linear or non-linear axially extending spacer elements.

Turning now to FIG. 6 where like numbering is used as FIG. 5, a number of electrocaloric modules are shown assembled together in a stack 30. While only two electrocaloric modules are shown any number can be used. As can be seen in FIG. 6, the spacers 28 promote maintaining a physical separation between adjacent electrocaloric elements to provide a fluid flow path 25 between the spacers and the adjacent electrocaloric elements. Although not required in all design configurations, in design configurations where the spacer elements are disposed adjacent to electrodes of opposite polarity, the spacer elements can be made from an electrically non-conductive material. In some embodiments, adjacent electrical bus elements 4a, 4b can have an interlocking configuration (with complementary contour of projections and recesses where a projection of one bus element projects is adjacent or projects into to a complementary recess of an adjacent bus element) as shown in FIG. 6. The electrical bus elements fit together to form bus bars that are connected through electrical connections (not shown) to an electrical power source (not shown). The bus bars can also serve as housing 17 if they are insulated on the outer surface.

Figure 7:
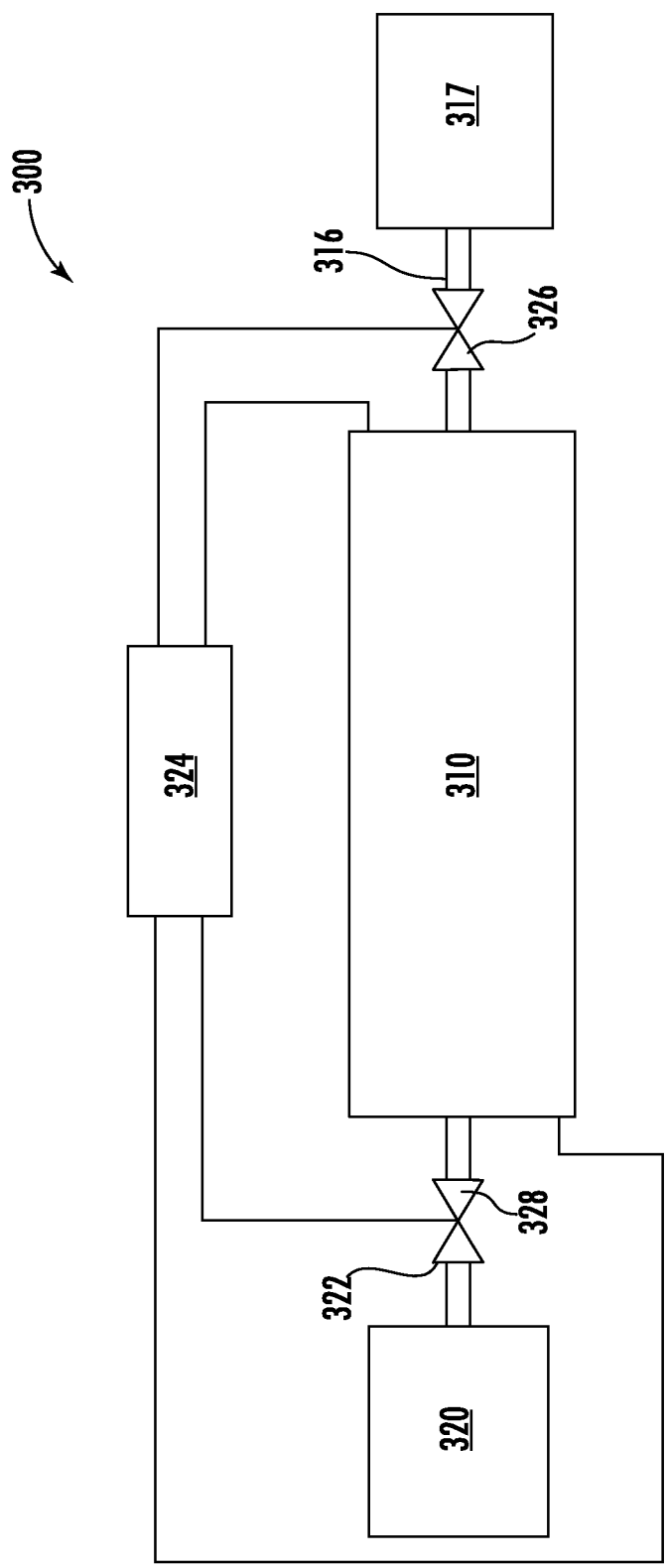
FIG. 7 is a schematic depiction of an example embodiment of an electrocaloric heat transfer system.

An example embodiment of a heat transfer system and its operation are further described with respect to FIG. 7. As shown in FIG. 7, a heat transfer system 300 comprises an electrocaloric module 310 such as the stack 30 of FIG. 6 or another configuration. The electrocaloric element is in thermal communication with a heat sink 317 through a first thermal flow path 318, and in thermal communication with a heat source 320 through a second thermal flow path 322. The thermal flow paths are described below with respect thermal transfer through flow of a heat transfer fluid through control valves 326 and 328 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 324 is configured to control electrical current to through a power source (not shown) to selectively activate the electrodes in the electrocaloric module. The controller 324 is also configured to open and close control valves 326 and 328 to selectively direct the heat transfer fluid along the first and second flow paths 318 and 322.

In operation, the system 300 can be operated by the controller 324 applying an electric field as a voltage differential across the electrocaloric element to cause a decrease in entropy and a release of heat energy by the electrocaloric elements. The controller 324 opens the control valve 326 to transfer at least a portion of the released heat energy along flow path 318 to heat sink 317. This transfer of heat can occur after the temperature of the electrocaloric elements has risen to a threshold temperature. In some embodiments, heal transfer to the heat sink 317 is begun as soon as the temperature of the electrocaloric elements increases to be about equal to the temperature of the heat sink 317. After application of the electric field for a time to induce a desired release and transfer of heat energy from the electrocaloric elements to the heat sink 317, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 320. The controller 324 closes control valve 326 to terminate flow along flow path 318, and opens control device 328 to transfer heat energy from the heat source 320 to the colder electrocaloric elements in order to regenerate the electrocaloric elements for another cycle.

In some embodiments, for example where a heat transfer system can be utilized to maintain a temperature in a conditioned space or thermal target, the electric field can be applied to the electrocaloric elements to increase its temperature until the temperature of the electrocaloric element reaches a first threshold. After the first temperature threshold, the controller 324 opens control valve 326 to transfer heat from the electrocaloric elements to the heat sink 317 until a second temperature threshold is reached. The electric field can continue to be applied during all or a portion of the time period between the first and second temperature thresholds, and is then removed to reduce the temperature of the electrocaloric elements until a third temperature threshold is reached. The controller 324 then closes control valve 326 to terminate heat flow transfer along heat flow path 318, and opens control valve 328 to transfer heat from the heat source 320 to the electrocaloric elements. The above steps can he optionally repeated until a target temperature of the conditioned space or thermal target (which can be either the heat source or the heat sink) is reached.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A heat transfer system comprising:
    an electrocaloric fabric comprising outer electrodes surrounding electrocaloric fibers wherein the electrocaloric fibers comprise electrocaloric material surrounding centrally located electrodes; and
    one or more supports for support and retention of the electrocaloric fabric and configured to provide header spaces for transport of working fluids to and from the electrocaloric fabric along a fluid flow path.

2. The heat transfer system of claim 1, wherein the fluid flow path is through the electrocaloric fabric.

3. The heat transfer system of claim 1, wherein the outer electrodes comprise a metallized layer, a doped semiconductor, an electrically conductive ceramic, a conductive polymer, or combination thereof.

4. The heat transfer system of claim 1, wherein the electrocaloric material comprises an inorganic material, electrocaloric polymer or polymer/ceramic composite.

5. The heat transfer system of claim 1, wherein the centrally located electrodes comprise carbon fiber, nanotube strand, metallic microwire, metal coated glass microwire, glass coated metal microwire, metal coated ceramic fiber, or metal coated polymer fiber.

6. The heat transfer system of claim 1, wherein the fabric has a thickness of 5 to 1000 micrometers.

7. The heat transfer system of claim 1, wherein the fabric has at least one edge wherein the electrocaloric material is absent at the edge.

8. The heat transfer system of claim 1, wherein the outer electrodes surround a yarn of the electrocaloric fibers.

9. The heat transfer system of claim 1, wherein the outer electrodes surround individual electrocaloric fibers.

10. The heat transfer system of claim 1, wherein the one or more supports are made from an electrically non-conductive material.

11. A heat transfer system comprising:
    electrocaloric fabrics each comprising outer electrodes surrounding electrocaloric fibers wherein the electrocaloric fibers comprise electrocaloric material surrounding centrally located electrodes; and
    spacers to maintain a physical separation between adjacent electrocaloric fabrics to provide a fluid flow path between the spacers and the adjacent electrocaloric fabrics.

12. The heat transfer system of claim 11, further comprising supports for support and retention of the electrocaloric fabrics.

13. The heat transfer system of claim 12, wherein the supports are configured to provide header spaces for transport of working fluids to and from the electrocaloric fabric along the fluid flow path.

14. The heat transfer system of claim 11, wherein the fluid flow path is through the electrocaloric fabric.

15. The heat transfer system of claim 11, wherein the spacers are disposed adjacent to electrodes of opposite polarity.

16. The heat transfer system of claim 11, wherein the spacers are made from an electrically non-conductive material.

17. The heat transfer system of claim 11, wherein each of the electrocaloric fabrics is connected to a bus, wherein the buses fit together to form bus bars that are connected through electrical connections to an electrical power source.

18. The heat transfer system of claim 11, wherein the electrocaloric fabrics are in thermal communication with;
    a heat sink through a first thermal flow path; and
    a heat source through a second thermal flow path.

19. The heat transfer system of claim 18, further comprising a controller configured to control electrical current to selectively activate the electrodes in the electrocaloric fabric.

20. The heat transfer system of claim 19, wherein the controller is also configured to:
    selectively direct heat transfer fluid along the first thermal flow path and the second thermal flow path;
    transfer released heat energy along the first thermal flow path to the heat sink; and
    terminate flow along the first thermal flow path and transfer heat energy from the heat source to colder electrocaloric fabrics in order to regenerate the electrocaloric fabrics for another cycle.

* * * * *